United States Patent [19]

Okamura et al.

[11] Patent Number: 5,705,271

[45] Date of Patent: Jan. 6, 1998

[54] METHOD FOR PRODUCING DIAMOND COATED MEMBER

[75] Inventors: Takashi Okamura; Takahisa Ushida, both of Aichi; Satoshi Iio, Gifu; Masakazu Watanabe, Aichi, all of Japan

[73] Assignee: NGK Spark Plug Co., Ltd., Aichi, Japan

[21] Appl. No.: 415,372

[22] Filed: Apr. 3, 1995

[30] Foreign Application Priority Data

Apr. 1, 1994 [JP] Japan .................. 6-085259
Mar. 16, 1995 [JP] Japan .................. 7-084895

[51] Int. Cl.$^6$ ......................................... C30B 29/04
[52] U.S. Cl. ................. 428/408; 428/212; 428/217; 428/141; 428/156
[58] Field of Search ........................ 428/408, 141, 428/156, 212, 217

[56] References Cited

U.S. PATENT DOCUMENTS

| | | | |
|---|---|---|---|
| 4,104,441 | 8/1978 | Fedoseev et al. | 428/408 |
| 5,082,359 | 1/1992 | Kirkpatrick | 428/408 |
| 5,114,696 | 5/1992 | Purdes | 423/446 |
| 5,173,089 | 12/1992 | Tanabe et al. | 51/293 |

FOREIGN PATENT DOCUMENTS

| | | |
|---|---|---|
| A-61-073882 | 4/1986 | Japan . |
| A-62-235295 | 10/1987 | Japan . |
| A-1-162770 | 6/1989 | Japan . |
| A-1-246361 | 10/1989 | Japan . |
| A-1-290591 | 11/1989 | Japan . |
| A-2-283697 | 11/1990 | Japan . |
| A-3-69595 | 3/1991 | Japan . |
| A-4-154969 | 5/1992 | Japan . |
| A-4-223806 | 8/1992 | Japan . |
| A-4-272179 | 9/1992 | Japan . |
| A-5-023903 | 2/1993 | Japan . |
| A-5-057508 | 3/1993 | Japan . |

OTHER PUBLICATIONS

English Translation of JP 63-277593.

*Primary Examiner*—Archene Turner
*Attorney, Agent, or Firm*—Morrison & Foerster LLP

[57] ABSTRACT

Diamond coating member is produced by a method comprising a first coating step in which the first diamond coating layer is closely formed on fine irregularity parts of a substrate having fine irregularities substantially without void left between them and the fine irregularities is engaged with the above first layer to coat the above substrate, and a second coating step in which the surface of the first coating layer is coated with a second diamond coating layer comprising diamond having a higher wear resistance than that of the first coating layer. The diamond coating member is excellent in adhesion between the diamond coating layer and the substrate and has high durability without having the diamond coating layer scaled off by mechanical shocks. It has high wear resistance and enables mass production without fluctuation in product quality.

6 Claims, 2 Drawing Sheets

D: DIAMOND COATING LAYER
S: SUBSTRATE

FIG. 4

D: DIAMOND COATING LAYER
V: VOID
S: SUBSTRATE

FIG. 5

D: DIAMOND COATING LAYER
V: VOID
S: SUBSTRATE 005,705,271

METHOD FOR PRODUCING DIAMOND COATED MEMBER

FIELD OF INDUSTRIAL UTILITY

The present invention relates to a method for producing a member having a diamond coating layer, more specifically to a method for producing various tool members such as milling cutters, bites (inserts), end mills and drills each having an excellent scale-off (or peeling-off) resistance, various abrasion (wear) resistant members such as valves and bearings, and heat radiating members such as heat sinks for electronic parts.

BACKGROUND OF THE INVENTION

There have so far been proposed various kinds of the methods for producing diamond-coated cutting tools having a diamond coating layer which is formed by the gas phase synthetic method. In addition to superiority in the wear resistance characteristic of a diamond film, the adhesive strength between a diamond coating film and a substrate is particularly important for using them as a cutting tool. In order to raise the adhesive strength between the substrate and the coat, there are a method in which the adhesion is allowed to be compatible with the abrasion resistance by varying conditions during synthesis (JP Patent Kokai JP-2-283697, 3-69595 and 4-223806), in addition to a method in which the adhesion is increased by synthesizing diamond of finer grains (JP Patent Kokai JP-A-62-235295 and 1-290591), and a method in which irregularities are formed on the surface of a substrate by surface treatment to provide an anchor effect between the substrate and a diamond coating layer, whereby the adhesive strength is improved (JP-A-1-162770, 1-246361 and 4-154969).

SUMMARY OF THE DISCLOSURE

With respect to the method for raising the adhesion, an effect can be obtained to some extent by these methods. However, the adhesive strength is not yet sufficient for using them as cutting tools to which an intermittent impact force is applied as is the case with, for example, milling, and a problem is caused that scaling-off of a diamond coating layer is generated.

Further, also in case of various wear resistant members other than tool members and heat radiating members such as a heat sink, the adhesive strength is still insufficient as well, and scaling-off of a diamond coating layer is generated.

It is a primary object of the present invention to provide a method for producing a diamond coating member, by which the above problems on conventional techniques are solved, in which particularly the adhesion is allowed to be compatible with the abrasion (wear) resistance, and which enables a stable production in an industrial scale and provides no fluctuation in product quality.

It is another object of the present invention to provide a diamond coated member which is obtainable using the method mentioned above according to the primary object.

Further objects of the present invention will become apparent from the entire disclosure.

According to the present invention, the primary object described above can be achieved by the following method for producing a diamond coating member, which results in an improved diamond coated member having an improved adhesion.

There is provided a method fop producing a diamond coated member, comprising:

a first coating step in which a first diamond coating layer is closely formed on fine irregularity part of a substrate having fine irregularities with substantially no void left between these and the first diamond coating layer to cause the first diamond coating layer engage with and coat the fine irregularity part, and a second coating step in which a surface of the first diamond coating layer is coated with a second diamond coating layer comprising diamond having a higher wear resistance than that of the first diamond coating layer.

Also there is provided a diamond coated member comprising:

a substrate, a first diamond coating layer which is closely disposed on and engaged with fine irregularity part the substrate having fine irregularities with substantially no void left between these and and the first diamond coating layer, and a second diamond coating layer disposed on the first diamond coating layer comprising diamond having a higher wear resistance than that of the first coating layer.

The above basic features of the method provide a basis for further concrete developments of the technology mentioned hereinbelow.

The second coating layer is formed preferably under the condition that diamond of a high crystallinity (more preferably, much higher crystallinity) than the first diamond coating layer is formed.

The irregularity part(s) of the substrate preferably comprises the fine irregularities having an aperture diameter of 0.5 to 5 µm, an aperture depth of 0.5 to 10 µm and an aperture interval of 5 µm or less.

The first diamond coating layer is formed preferably at a film forming rate of 0.1 to (less than) 1 µm/h.

The second diamond coating layer is formed preferably at a film forming rate of 1 to 2 µm/h.

The first diamond coating layer is formed preferably in a thickness of 1 to 3 µm.

The second diamond coating layer is formed preferably in a thickness of 5 to 100 µm.

The first diamond coating layer described above is formed preferably by a gas phase synthetic method in which a mixed gas comprising hydrogen of 90 to 99.5 volume %, methane of 0 to 1.5 volume % and carbon monoxide of 0 to 10 volume % is reacted.

The second diamond coating layer described above is formed preferably by a gas phase synthetic method in which a mixed gas comprising hydrogen of 80 to 93 volume %, methane of 0 to 2 volume % and carbon monoxide of 7 to 20 volume % is reacted.

The first diamond coating layer is formed preferably at a temperature of 750° to 950° C.

The first diamond coating layer described above is formed preferably by a gas phase synthetic method in which a mixed gas comprising hydrogen of 99 to 99.5 volume % and methane of 0.5 to 1.0 volume % is reacted at the temperature of 750° to 850° C.

The first diamond coating layer is formed preferably by a gas phase synthetic method in which a mixed gas comprising hydrogen of 94 to 97 volume % and carbon monoxide of 3 to 6 volume % is reacted at the temperature of 800° to 900° C.

Effects of the Invention are summarized as follows:

The production method for the diamond coating member according to the present invention comprises the first coating step in which the first diamond coating layer is closely formed on the irregular parts of a substrate having fine irregularities substantially without void left between them and the above substrate is engaged with the above first diamond coating layer to coat the fine irregularities, and the second coating step in which the surface of the first diamond coating layer is coated with the second diamond coating layer comprising diamond having a higher wear resistance than that of the first diamond coating layer. Accordingly, there can be produced the diamond coating member which is excellent in the adhesion between the diamond coating layer and the substrate and which has a high durability without having the diamond coating layer scaled- or peeled off by the mechanical shocks.

Further, the diamond coating member which enables the mass production in an industrial scale and provides no fluctuation in the product quality can be produced by the production method of the present invention.

DETAILED DESCRIPTION OF THE PREFERRED EMBODIMENTS

There can be used as a substrate, for example, those which can stand a gas phase synthetic method for a diamond film, such as a sintered super hard alloy (termed as "cemented carbide"), cermet, silicon nitride and other ceramics. The fine irregularities mean those having an aperture diameter of 5 μm or less.

Means for forming the fine irregularities on the substrate includes a method utilizing a chemical reaction by etching with hydrogen plasma and/or acids, and a method in which physical processing is carried out by abrasive grains, cutters and sand blast. In the case where the substrate is a sintered compact of cemented carbide, for example, there is a treatment in a mixed gas comprising a small amount of $N_2$ and the balance being Ar. To be concrete, it is as follows.

A method for forming fine irregularities, in which:
(a) A WC-based cemented carbide containing WC as a main component
(b) is subjected to heat treatment under an atmospheric pressure ambience (including 0.5 to 1.5 atmospheric pressure) containing $N_2$ gas of 0.05 to 5 volume % at a temperature generating a liquid phase of the above WC based cemented carbide or higher and a sintering temperature or lower,
(c) to thereby form an N-containing irregularity surface layer on the surface of the above WC-based cemented carbide.

Preferably formed is an N-containing irregularity surface layer comprising mainly at least one of W—Ti—C—N solid solution and W—Ti—Ta—C—N solid solution.

In the above method for forming the fine irregularities, when $N_2$ gas in the heat treatment atmosphere at atmospheric pressure is less than 0.05 volume %, it is difficult to form the N-containing irregularity surface layer because of a little amount of N in the atmosphere, and when it exceeds 5 volume %, a binding phase (for example, Co) contained in the WC-based sintered cemented carbide is deposited on the surface in a large amount to lower the adhesion in coating diamond.

When the heat treating temperature is lower than a temperature for forming a liquid phase of the WC-based sintered cemented carbide, irregularities on the N-containing irregularity surface layer are insufficient, and the adhesion in coating diamond is insufficient. When it exceeds the sintering temperature, the grains constituting the sintered cemented carbide described above are grown, and characteristics such as the strength is reduced in some cases. Since the heat treatment is carried out under the atmospheric pressure, continuous treatment not only in a batch type furnace but also in a tunnel kiln becomes possible, and large merit is included in terms of costs and productivity.

The WC-based sintered cemented carbide contains WC as a main component, and as other components, there can be used preferably those containing Ti or the same and Ta, and at least one of Co and Ni as a bonding phase. In this case, it is a preferred composition of the WC-based sintered hard alloy comprising 0.2 to 20 weight % (preferably 0.5 to 10 weight %, more preferably 1 to 5 weight %) for Ti or the same and Ta calculated in terms of carbide, and 2 to 15 weight % (preferably 3 to 10 weight %, more preferably 4 to 7 weight %) for at least one of Co and Ni. The alloy described above has at least one of W—Ti—C solid solution (β phase) and W—Ti—Ta—C solid solution (β t phase). The preferred average crystal grain diameters of the β phase and the β t phase described above range from 0.5 to 10 μm (more preferably 1 to 5 μm).

When Ti is less than 0.2 weight % calculated in terms of carbide, it is difficult to form an N-containing irregularity surface layer by heat treatment, and the surface layer itself is liable to scale off after the heat treatment. The reason for liability to peel off is that almost the entire of Ti component migrates to a surface, so that W—Ti—C—N solid solution (β (N) phase) is formed on the surface and that the Ti component is separated from the other alloy components to thereby lower the engagement state. When Ti exceeds 20 weight % calculated in terms of carbide, it is already fragile before the heat treatment, and since it brings about an increased thermal expansion coefficient, difference from that of diamond is grown, and shear stress is generated at an interface between the substrate and the diamond film to be liable to cause film peeling.

It is based on the same reason as above, why a preferred upper limit is 20 weight % when Ta is added in addition to Ti.

A part or the entire of Ta can be replaced with at least one of V, Zr, Nb and Hf to such an extent that an adverse influence is not exerted. The WC-based sintered cemented carbide obtained by densely sintering the respective powders of WC, TiC, TaC and Co, etc. by a powder metallurgical method is reduced in a strength if the carbide crystal phase described above is grown to grains during the sintering, and accordingly, at least one of Cr and Mo which suppress grain growth during the sintering can be incorporated usually in the form of carbide to such an extent that an adverse influence is not exerted to heat treatment in the fine irregularity forming method described hereinabove.

In the case where the content of at least one of Co and Ni as a binding phase is less than 2 weight %, densification by sintering upon producing the WC-based sintered cemented carbide is difficult, and characteristics such as strength required for the substrate are insufficient. Meanwhile, in the case where it exceeds 15 weight %, these components are liable to appear on a substrate surface during the heat treatment or forming the diamond coating layer in the present invention, and an adverse influence is exerted to the formation of the diamond coating layer in some cases. Further, difference in the thermal expansion coefficient from the diamond coating layer is increased, which leads to film peeling in some cases.

In the case where the average crystal grain diameter of the β phase and the β t phase is less than 0.5 μm, the irregularities on an N-containing surface layer which is formed after the heat treatment are small, and the engagement between the N-containing surface layer and the inner layer of the WC-based sintered cemented carbide is not sufficiently achieved in some cases. That exceeding 10 μm makes the above engagement insufficient and does not provide a strength as the WC-based sintered cemented carbide before the heat treatment in some cases.

In case of an N-containing sintered cemented carbide and cermet in which the β (N) phase is formed in advance by sintering after adding powders containing N such as TiN and TiC—TiN solid solution or by sintering in an atmosphere in which nitrogen atoms are contained, irregularities are hard to be formed on the surface layer even by the heat treatment in the irregularity-forming method described hereinabove, or it becomes difficult or unstable to control the irregularity state in the heat treatment using atmospheres, e.g., mentioned herein.

In order to accurately control the $N_2$ content in the atmosphere in the heat treatment of the WC-based sintered cemented carbide, a furnace used for the heat treatment is composed of refractories which do not exert an adverse influence to the $N_2$ content in the atmosphere, and a furnace comprising refractories such as BN etc. is not used.

The heat treating of the WC-based sintered cemented carbide is preferably at 1350° to 1450° C., and with the lower limit temperature varying depending on the proportion of carbon to Co and Ni contained in the alloy.

The heat treating time is a factor which exerts an influence most to the degree of the irregularities on the N-containing surface layer, and controlling this can allow the N-containing surface layer to have arbitrary irregularities formed. In order to efficiently and stably obtain the N-containing layer, the heat treating temperature and the N content in the atmosphere are controlled, and the heat treating time is set preferably to 0.5 to 5 hours.

The atmosphere in the heat treatment contains $N_2$ of 0.05 to 5 volume %, preferably 0.5 to 3 volume % at atmospheric pressure with the balance being inert gas such as Ar.

After forming an N-containing irregularity surface layer by the fine irregularity-forming method described above, reheat treatment may be carried out in an inert atmosphere such as argon to such an extent that the film adhesion of the surface layer described above is not varied, to thereby release N from the above surface layer.

As further methods for obtaining an equivalent effect (N is prevented from being contained in an uppermost layer) to the reheat treatment described above, a hard coating layer such as TiC etc. may be coated by known methods such as CVD and PVD in such a thickness that the surface formed on the irregularity surface layer is not changed so much.

The fine irregularities on the surface of the substrate having fine irregularities are intended to generate an anchor effect between the diamond coating layer and the substrate, and the preferred fine irregularities are fine irregularities having an aperture diameter of 0.5 to 5 μm (preferably 0.5 to 2 μm), an aperture depth of 0.5 to 10 μm (preferably 1 to 4 μm) and an aperture interval (interval between the centers of two apertures which are adjacent to each other) of 5 μm or less (preferably 1 to 3 μm). The aperture diameter and depth each less than 0.5 μm does not improve the adhesive strength and gives a tendency to provide no difference from a substrate which is not subjected to irregularity processing. Since the aperture diameter of 5 μm or more and the aperture depth of 10 μm or more take too long time for coating the fine irregularity parts substantially without void in the first coating process, it tends to a worsened productivity, and in addition, since the surface smoothness of the coated diamond film is deteriorated, it tends to a worsened cutting performance when it is used as a cutting tool. Further, the aperture interval exceeding 5 μm does not provide a sufficient anchor effect and gives a tendency to lower the effect of improvement in the adhesive strength between the substrate and the diamond coating layer.

First Coating Step:

The first diamond coating layer is closely formed on the fine irregularity parts of a substrate having fine irregularities substantially without void. That is, it is formed so that there are no coarse void which exert an adverse influence on the adhesive strength between the substrate and the first diamond coating layer described hereinabove to lower the adhesive strength.

In the present invention, it is preferred that no void is found at all but it will not be denied that very fine voids may be present to such an extent that the influence is scarcely exerted to the adhesive strength between the substrate and the film or that a very small amount of voids are present. Such the allowable voids can be controlled in the following manner.

A diamond coating member is carefully cut vertically to a substrate surface, and a coated part in the cutting plane thereof is observed for several arbitrary visual fields by magnifying them by 1000 to 5000 times with a scanning electron microscope (SEM). An interfacial length at a substrate side in this case, which is determined by measurement with photographic observation or an image processor, is designated as "A". Meanwhile, when the sum of lengths of the void parts (parts which do not contact the substrate) within the interfaces at the diamond film (the first coating layer) side in the same visual field is designated as "B", those which are of B/A≦0.1 (preferably B/A≦0.05) are to fall in the range of the present invention.

Determining the ratio B/A described above in the photos shown in FIG. 3 to FIG. 5 in the example and the comparative examples each described later only for reference, it is 0.04 in FIG. 3, 0.2 in FIG. 4 and 0.3 in FIG. 5.

The diamond coating layer is formed by means of a gas phase synthetic method in which a raw material gas is excited to deposit on a substrate. There can be applied as an exciting method for the gas, a hot filament method in which a tungsten filament disposed in the vicinity of the substrate is heated to 2000° C. or higher to excite the raw material gas by that heat and a method in which microwave which is an electromagnetic wave of 1 to 100 GHz is guided to the vicinity of the substrate through a wave guide to convert the raw material gas to plasma or the raw material gas is converted to plasma by direct current discharge. Among them, the method for depositing diamond by the microwave plasma method is preferred because of higher stability.

Figure 1:
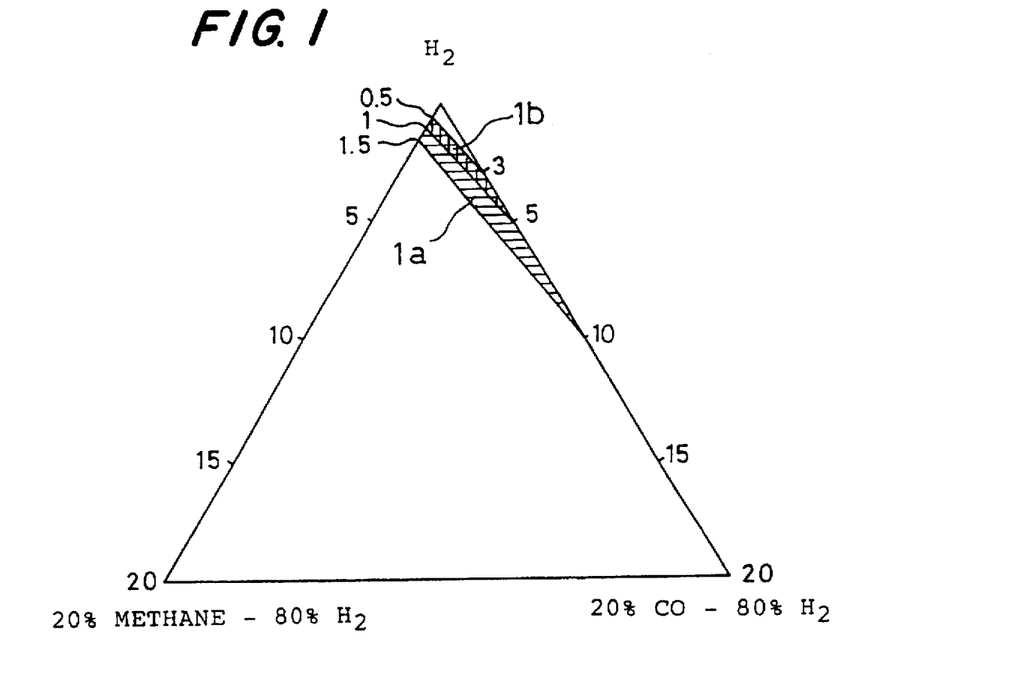
FIG. 1 A figure which shows a compositional range of a mixed gas used in forming the first coating layer by a gas phase synthetic method.

The first diamond coating layer can be formed by a gas phase synthetic method in which a mixed gas comprising either or both of methane gas and carbon dioxide gas and hydrogen gas is reacted. Used as a preferred mixed gas is that comprising hydrogen of 90 to 99.5 volume % (more preferably 95 to 99.5 volume %), methane of 0 to 1.5 volume % (more preferably 0 to 1 volume %) and carbon monoxide of 0 to 10 volume % (more preferably 0 to 5 volume %). The composition range of this mixed gas is shown in a three component composition coordinate system of hydrogen, methane and carbon monoxide in FIG. 1. The ranges shown by 1a and 1b in FIG. 1 are a preferred composition range, and a more preferred range is a range shown by 1b.

The mixed gas falling outside the above range provides a tendency that a high nucleus-generating density of diamond is not obtained even if the synthesis temperature and the synthesis speed are changed. Since there is a tendency that larger voids are generated between the substrate and the film, and the engagement state becomes relatively inferior, there is a tendency that a high adhesive strength is hard to be obtained.

The first diamond coating layer is synthesized at a rate of 0.1 to (less than) 1 μm/h (preferably 0.4 to 0.9 μm/h). In case of a synthesis condition of fast growth in which the synthesis rate exceeds 1 μm/h, since the apertures of irregularities are covered with diamond coating layer before sufficiently filling up the irregularities on the surface of a substrate, there is a tendency that larger voids are generated between the substrate and the film, and the engagement state becomes relatively inferior. Accordingly, there is a tendency that a high adhesive strength is hard to be obtained. Meanwhile, since the growing rate is too slow in a synthesis condition of 0.1 μm/h or less, there is a tendency that a film which coats the surface is hard to be formed and that it takes too much time to grow it to a prescribed film thickness. In this case, setting the synthesis temperature to 750° C. or higher and lower than 850° C. can provide the synthesis rate described above.

In the case where the synthesis temperature is 850° C. or higher, even in the case where it is, for example, 900° C., the synthesis rate described above can be obtained by properly selecting the composition of the above mixed gas for forming the first diamond coating layer from the composition range described above.

In the case where the synthesis temperature exceeds 950° C., the concentration of hydrocarbon gas (methane gas) has to be controlled low in order to cause the synthesis rate to fall within the range of 0.1 to 1 μm/h, and accordingly, the carbon content supplied is decreased. It is considered that since that delays the growing rate of diamond seed crystal, and the decomposition rate by plasma etching is faster than the growing rate to the critical nucleus size or more, the film is difficult to be formed. Further, there is a tendency that the concentration of methane gas which resides at a lower concentration side narrows the critical region in which the film can be formed and markedly worsens the controllability. Further, a synthesis temperature exceeding 1000° C. provides a tendency that the substrate itself is decomposed when the sintered cemented carbide is used for a substrate.

The first diamond coating layer is coated in a thickness of 1 to 3 μm. The film thickness less than 1 μm provides a tendency that the irregularities on the substrate is difficult to be sufficiently be filled up with diamond, and it provides a tendency that since subsequent shift to the synthesis of the coating layer in the second coating step causes voids to remain between the fine irregularities on the substrate and the diamond coating layer in some cases, a sufficient adhesive strength is hard to be obtained. Since the diamond coating layer synthesized under this condition is inferior in the wear resistance as compared with a diamond coating layer synthesized under the condition of the second coating step described above, there is a tendency that a film thickness exceeding 3 μm deteriorates the durability.

Second Coating Step:

The second diamond coating layer comprises diamond having a higher abrasion resistance than that of the first coating layer.

Figure 2:
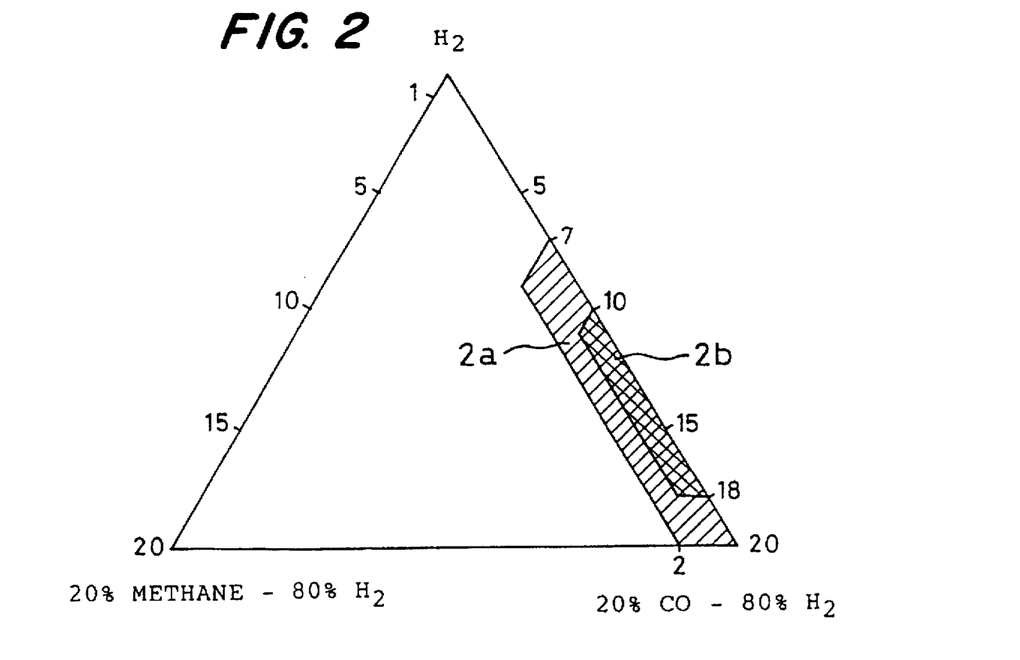
FIG. 2 A figure which shows a compositional range of a mixed gas used in forming the second coating layer by a gas phase synthetic method.

Such a second diamond coating layer can be formed by a gas phase synthetic method in which a mixed gas comprising either or both of methane gas and carbon dioxide gas and hydrogen gas is reacted. Used as a preferred mixed gas is that comprising hydrogen of 80 to 93 volume % (more preferably 82 to 90 volume %), methane of 0 to 2 volume % (more preferably 0 to 1 volume %) and carbon monoxide of 7 to 20 volume % (more preferably 10 to 18 volume %). The composition range of this mixed gas is shown in a three component composition coordinate system of hydrogen, methane and carbon monoxide in FIG. 2. The ranges shown by 2a and 2b in FIG. 2 are a preferred composition range, and a more preferred range is shown by 2b.

The mixed gas falling outside the above range provides a tendency that highly crystalline diamond is difficult to be obtained even if the synthesis temperature and the synthesis rate are changed. Accordingly, there is a tendency that the abrasion resistance characteristic is lowered.

The level of crystallinity of diamond can be compared by the Raman spectroscopic method. The smaller the full widths at half maximum (FWHM) of the Raman spectrum peak which appears in the vicinity of 1333 $cm^{-1}$ (it is shifted between 1330 and 1340 $cm^{-1}$ depending on impurities in some cases), the higher the crystallinity of diamond is. For the diamond having a high crystallinity in the present invention, 15 $cm^{-1}$ or less is preferred, 12 $cm^{-1}$ or less is more preferred, and 10 $cm^{-1}$ or less is further more preferred.

The second diamond coating layer is synthesized at a rate of 1 to 2 μm/h (preferably 1.4 to 1.8 μm/h).

The synthesis rate less than 1 μm/h provides a tendency to take time for the synthesis of a thick film. A synthesis condition exceeding 2 μm/h provides a tendency to cause carbon components other than diamond, such as graphite to be formed in a synthesized coating layer and the crystallinity of diamond to be deteriorated. Accordingly, there is a tendency to a reduced abrasion resistance characteristic.

There is also a method for obtaining highly crystalline diamond, in which oxygen gas is added to the mixed gas of hydrocarbon gas and hydrogen gas in addition to the method using the mixed gas of carbon monoxide gas and hydrogen gas. However, in terms of that the diamond coat synthesized using the mixed gas of carbon monoxide gas and hydrogen gas is excellent in the wear resistance characteristic and a problem on handling such as risk in explosion, the carbon monoxide gas is preferably used. In this case, setting the synthesis temperature to 850° C. or higher and less than 950° C. can provide the synthesis rate described above.

The second diamond coating layer can be formed in a thickness of 5 to 100 μm. Switching of the synthesis condition from the first coating step over to the second coating step may be either intermittent or continuous, and since the switching over causes an interface to be formed in the diamond film in some cases, the continuous switching over is preferred.

EXAMPLES

In the following, Examples will be explained in more detail.

As a substrate, a sintered cemented carbide of an ISO standard SPGN120308 form, which has a composition comprising WC-5% (Ti, Ta) C-5% Co, was prepared in the following manner.

WC powder and TiC-WC solid solution powder, each having an average particle diameter of 2 μm, TaC powder and Co powder having an average particle diameter of 1 μm, were prepared as raw material powders. These raw material powders were blended so that the composition described above was obtained after sintering, and the mixed powders were subjected to wet milling. After drying, it was subjected to press molding to a green compact at the pressure of 147 kPa (1.5 ton/cm$^2$), this green compact was sintered in vacuum at 1450° C. for one hour, whereby a sintered compact having the composition described above was produced. The surface of this sintered compact was subjected to grinding processing to obtain a sintered compact having the form described above.

This sintered compact was put in a mixed gas of 1 atmospheric pressure containing 0.1% N$_2$ with the balance being Ar, and it was subjected to heat treatment by maintaining it at 1375° C. for one hour, whereby a substrate having irregularities which have an aperture (void) diameter of about 1 to 3 μm, an aperture depth of about 2 to 6 μm and an aperture interval of about 2 to 4 μm on the substrate thereof was obtained.

The substrate thus obtained was dipped in a solvent in which diamond fine powder having an average grain diameter of 10 μm was dispersed and was subjected to supersonic wave treatment to activate the surface.

The insert thus obtained was disposed in a microwave plasma CVD apparatus of 2.45 GHz with a total pressure adjusted to 5.33 kPa (40 Torr), and diamond-coated cutting inserts (Samples No. 1 to 34) having film thicknesses approximately of 10 to 50 μm were prepared under the conditions shown in Tables 1 to 2.

These inserts were used to carry out cutting tests under the following conditions to find that as shown in Tables 1 to 2, the diamond-coated inserts of the present invention had a longer life time during which works could be cut at an excellent surface precision without having a diamond film peeled off, and thus showed excellent characteristics.

Continuous cutting: turning (circumference of a cylindrical work having a diameter of about 150 mm and a length of about 200 mm is processed).

Work: Al-18 wt % Si alloy.

Cutting speed: 800 m/min.

Feed: 0.15 mm/rev.

Depth of cut: 0.5 mm.

Intermittent cutting: milling cutter (surface of rectangular plate work having dimensions of about 150×150 mm and a thickness of about 50 mm is processed).

Work: Al-18 wt % Si alloy.

Cutting speed: 800 m/min.

Feed: 0.1 mm/tooth.

Depth of cut: 0.5 mm.

Figure 3:
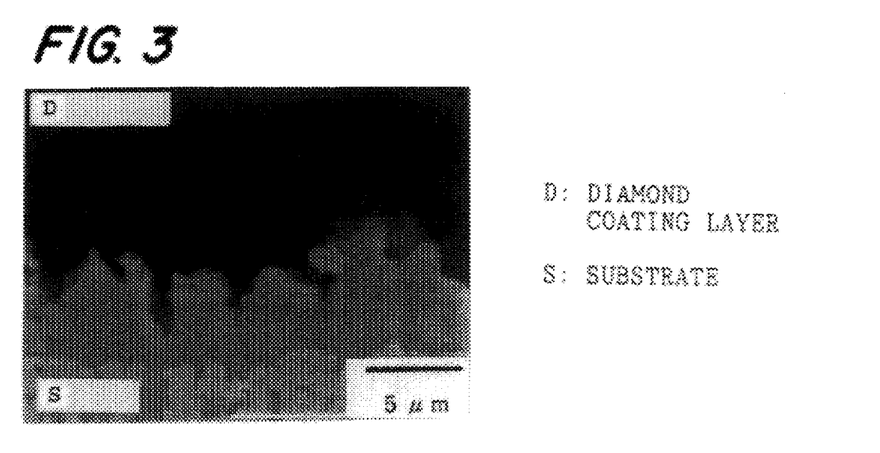
FIG. 3 A photograph showing a microstructure in the section of an end part in Sample No. 1 insert of an Example of the present invention.

A section of an edge part of Sample No. 1 insert was observed. As shown in FIG. 3, a state in which diamond was penetrated into the irregularities on the surface of the substrate substantially without void, and engagement was excellent was observed.

TABLE 1

| Sample No. | First step | | | | | | | Second Step | | | | | | Syn-thesis time (hour) | Film thick-ness (μm) | Cutting time resulting in peeling | |
|---|---|---|---|---|---|---|---|---|---|---|---|---|---|---|---|---|---|
| | Gas flow amount (cc/min) | | | Temper-ature (°C.) | Filming rate (μm/h) | Synthesis time (hour) | | Gas flow amount (cc/min) | | | Temper-ature (°C.) | Filming rate (μm/h) | | | | Continuous cutting (min) | Intermittent cutting (min) |
| | H$_2$ | CH$_4$ | CO | | | | | H$_2$ | CH$_4$ | CO | | | | | | | |
| 1 (Inv.) | 97 | 0 | 3 | 800 | 0.4 | 5 | | 90 | 0 | 10 | 900 | 1.4 | 5.5 | 10 | >65 | >55 |
| 2 (Inv.) | 97 | 0 | 3 | 800 | 0.4 | 5 | | 92 | 0 | 8 | 900 | 1.2 | 6.5 | 10 | >65 | >55 |
| 3 (Inv.) | 95 | 0 | 5 | 800 | 0.6 | 4 | | 90 | 0 | 10 | 900 | 1.4 | 5.5 | 10 | >65 | >45 |
| 4 (Inv.) | 95 | 0 | 5 | 800 | 0.6 | 4 | | 85 | 0 | 15 | 900 | 1.8 | 4.5 | 10 | >65 | >45 |
| 5 (Inv.) | 95 | 0 | 5 | 800 | 0.6 | 4 | | 92 | 0 | 8 | 900 | 1.2 | 6.5 | 10 | >65 | >45 |
| 6 (Inv.) | 95 | 0 | 5 | 800 | 0.6 | 4 | | 90 | 0 | 10 | 950 | 1.9 | 4.0 | 10 | >50 | >45 |
| 7 (Inv.) | 99 | 1 | 0 | 800 | 0.4 | 5 | | 90 | 0 | 10 | 900 | 1.4 | 6 | 10 | >55 | >35 |
| 8 (Inv.) | 99 | 1 | 0 | 800 | 0.4 | 5 | | 85 | 0 | 15 | 900 | 1.8 | 4.5 | 10 | >55 | >35 |
| 9 (Inv.) | 99 | 1 | 0 | 800 | 0.4 | 5 | | 92 | 0 | 8 | 900 | 1.2 | 7 | 10 | >55 | >35 |
| 10 (Inv.) | 99.5 | 0.5 | 0 | 800 | 0.2 | 6 | | 90 | 0 | 10 | 900 | 1.4 | 6.5 | 10 | >60 | >35 |
| 11 (Inv.) | 99.5 | 0.5 | 0 | 800 | 0.2 | 5 | | 92 | 0 | 8 | 900 | 1.2 | 7.5 | 10 | >60 | >35 |
| 12 (Inv.) | 99.5 | 0.5 | 0 | 800 | 0.2 | 15 | | 92 | 0 | 8 | 900 | 1.2 | 6 | 10 | >55 | >35 |
| 13 (Inv.) | 99.5 | 0.5 | 0 | 800 | 0.2 | 5 | | 85 | 0 | 15 | 900 | 1.8 | 5 | 10 | >60 | >35 |
| 14 (Inv.) | 99.5 | 0.5 | 0 | 800 | 0.2 | 15 | | 85 | 0 | 15 | 900 | 1.8 | 4 | 10 | >55 | >35 |
| 15 (Inv.) | 90 | 0 | 10 | 800 | 0.9 | 2 | | 90 | 0 | 10 | 900 | 1.4 | 6 | 10 | >50 | >30 |
| 16 (Inv.) | 90 | 0 | 10 | 800 | 0.9 | 1.5 | | 92 | 0 | 8 | 900 | 1.2 | 7 | 10 | >50 | >30 |
| 17 (Inv.) | 90 | 0 | 10 | 800 | 0.9 | 3 | | 92 | 0 | 8 | 900 | 1.2 | 6 | 10 | >50 | >30 |

TABLE 2

| Sample No. | First step | | | | | | Second Step | | | | | | Syn-thesis time (hour) | Film thick-ness (μm) | Cutting time resulting in peeling | |
|---|---|---|---|---|---|---|---|---|---|---|---|---|---|---|---|---|
| | Gas flow amount (cc/min) | | | Temper-ature (°C.) | Filming rate (μm/h) | Synthesis time (hour) | Gas flow amount (cc/min) | | | Temper-ature (°C.) | Filming rate (μm/h) | | | | Continuous cutting (min) | Intermittent cutting (min) |
| | $H_2$ | $CH_4$ | CO | | | | $H_2$ | $CH_4$ | CO | | | | | | | |
| 18 (Inv.) | 90 | 0 | 10 | 800 | 0.9 | 1.5 | 85 | 0 | 15 | 900 | 1.8 | 5 | 10 | >50 | >30 |
| 19 (Inv.) | 90 | 0 | 10 | 800 | 0.9 | 3 | 85 | 0 | 15 | 900 | 1.8 | 4 | 10 | >50 | >30 |
| 20 (Inv.) | 95 | 0 | 5 | 900 | 0.8 | 3 | 85 | 0 | 15 | 900 | 1.8 | 4 | 10 | >60 | >40 |
| 21 (Inv.) | 95 | 0 | 5 | 900 | 0.8 | 3 | 90 | 0 | 10 | 950 | 1.9 | 6.5 | 15 | >65 | >50 |
| 22 (Inv.) | 99 | 1 | 0 | 800 | 0.4 | 5 | 89 | 1 | 10 | 900 | 1.5 | 8.5 | 15 | >70 | >50 |
| 23 (Inv.) | 99 | 1 | 0 | 800 | 0.4 | 5 | 84 | 1 | 15 | 900 | 2.0 | 6.5 | 15 | >65 | >50 |
| 24 (Inv.) | 97 | 0 | 3 | 800 | 0.4 | 5 | 85 | 0 | 15 | 900 | 1.8 | 7 | 15 | >70 | >55 |
| 25 (Inv.) | 98 | 0.5 | 1.5 | 800 | 0.4 | 5 | 86.5 | 0.5 | 13 | 900 | 1.7 | 7.5 | 15 | >70 | >55 |
| 26 (Inv.) | 99 | 1 | 0 | 800 | 0.4 | 5 | 85 | 0 | 15 | 900 | 1.8 | 10 | 20 | >80 | >50 |
| 27 (Inv.) | 95 | 1 | 4 | 850 | 0.7 | 4 | 85 | 0 | 15 | 900 | 1.8 | 9.5 | 20 | >80 | >60 |
| 28 (Inv.) | 95 | 0 | 5 | 900 | 0.8 | 3 | 85 | 0 | 15 | 900 | 1.8 | 9.5 | 20 | >80 | >60 |
| 29 (Inv.) | 97 | 0 | 3 | 800 | 0.4 | 5 | 85 | 0 | 15 | 900 | 1.8 | 16 | 30 | >110 | >70 |
| 30 (Inv.) | 95 | 1 | 4 | 850 | 0.7 | 4 | 85 | 0 | 15 | 900 | 1.8 | 15 | 30 | >100 | >70 |
| 31 (Inv.) | 95 | 0 | 5 | 900 | 0.8 | 3 | 85 | 0 | 15 | 900 | 1.8 | 15 | 30 | >110 | >80 |
| 32 (Inv.) | 95 | 1 | 4 | 850 | 0.7 | 4 | 85 | 0 | 15 | 900 | 1.8 | 21 | 40 | >130 | >100 |
| 33 (Inv.) | 95 | 0 | 5 | 900 | 0.8 | 3 | 85 | 0 | 15 | 900 | 1.8 | 21 | 40 | >130 | >110 |
| 34 (Inv.) | 95 | 0 | 5 | 900 | 0.8 | 3 | 85 | 0 | 15 | 900 | 1.8 | 26.5 | 50 | >150 | >120 |

Comparative Example 1

The substrates which had been provided on the surfaces thereof with the same irregularities as those in the Example described above by the same heat treatment as that in the above example were coated with diamond under the respective conditions for Samples No. 35 to 62 shown in Tables 3 to 4. These inserts were used to carry out the cutting tests in the same conditions as those in the example, and the results that films were peeled off in a short time and that the durability was inferior were obtained as shown in Tables 3 to 4.

Figure 4:
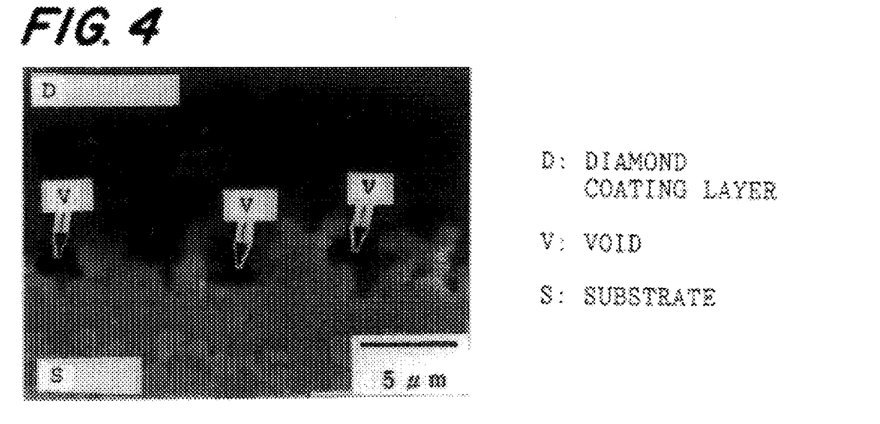
FIG. 4 A photograph showing a crystal structure in the section of an end part in Sample No. 42 insert of a comparative example.
Figure 5:
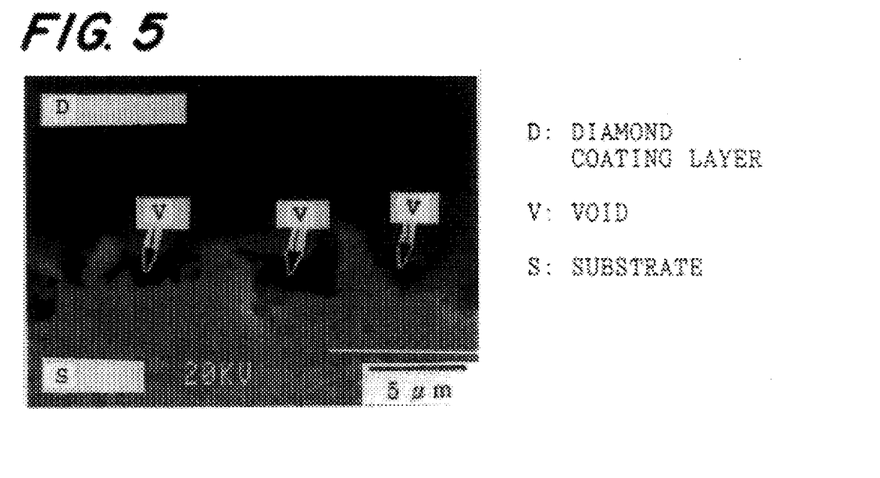
FIG. 5 A photograph showing a crystal structure in a section of an end part in Sample No. 53 insert of a comparative example.

Similarly to the Example, there were shown a sectional photograph of the insert of Sample No. 42 in FIG. 4 and a sectional photograph of the insert of Sample No. 53 in FIG. 5. Coarse voids remain between the irregularities on the substrate surface and the diamond coating layer, and the state that engagement was inferior was observed.

Comparative Example 2

Diamond was coated under the conditions shown in Table 4 on the substrates (Samples No. 63 and 64) obtained by subjecting the same sintered cemented carbide compacts as those in the example described above to grinding processing (surface roughness Rz=about 0.2 μm) without subjecting them to irregularity-forming treatment as shown in the Example, and the substrates (Samples No. 65 and 66) which were provided on the surfaces thereof with the irregularities having an aperture diameter of about 6 μm, an aperture depth of about 15 μm and an aperture interval of about 10 μm by subjecting the same to heat treatment by maintaining them at 1375° C. for 10 hours in a mixed gas of 1 atmospheric pressure containing $N_2$ of 1 volume % with the balance being Ar. These inserts were used to carry out the cutting tests under the same conditions as those in the Example, and the results that films were peeled off in a short time and that the durability was inferior were obtained as shown in Table 4.

It should no noted that modification apparent in the art can be made from the disclosed embodiments without departing the gist and scope of the present invention as disclosed herein and defined by the claim as annexed.

TABLE 3

| Sample No. | First step | | | | | | Second Step | | | | | | Syn-thesis time (hour) | Film thick-ness (μm) | Cutting time resulting in peeling | |
|---|---|---|---|---|---|---|---|---|---|---|---|---|---|---|---|---|
| | Gas flow amount (cc/min) | | | Temper-ature (°C.) | Filming rate (μm/h) | Synthesis time (hour) | Gas flow amount (cc/min) | | | Temper-ature (°C.) | Filming rate (μm/h) | | | | Continuous cutting (min) | Intermittent cutting (min) |
| | $H_2$ | $CH_4$ | CO | | | | $H_2$ | $CH_4$ | CO | | | | | | | |
| 35 (Comp.) | 90 | 0 | 10 | 900 | 1.4 | 7.5 | — | — | — | — | — | — | 10 | <20 | <5 |
| 36 (Comp.) | 85 | 0 | 15 | 900 | 1.8 | 5.5 | — | — | — | — | — | — | 10 | <10 | <5 |
| 37 (Comp.) | 85 | 0 | 15 | 900 | 1.8 | 8.5 | — | — | — | — | — | — | 15 | <30 | <20 |
| 38 (Comp.) | 85 | 0 | 15 | 900 | 1.8 | 11.5 | — | — | — | — | — | — | 20 | — | — |
| 39 (Comp.) | 85 | 0 | 15 | 900 | 1.8 | 22.5 | — | — | — | — | — | — | — | — | — |
| 40 (Comp.) | 99 | 1 | 0 | 900 | 1.2 | 8.5 | — | — | — | — | — | — | 10 | <10 | <5 |
| 41 (Comp.) | 95 | 0 | 5 | 800 | 0.6 | 16.5 | — | — | — | — | — | — | 10 | <30 | <20 |
| 42 (Comp.) | 95 | 0 | 5 | 800 | 0.6 | 8.5 | 90 | 0 | 10 | 900 | 1.4 | 3.5 | 10 | <20 | <10 |
| 43 (Comp.) | 95 | 0 | 5 | 800 | 0.6 | 1.5 | 90 | 0 | 10 | 900 | 1.4 | 6.5 | 10 | <10 | <5 |

TABLE 3-continued

| Sample No. | First step | | | | | | Second Step | | | | | | Syn-thesis time (hour) | Film thick-ness (μm) | Cutting time resulting in peeling | |
|---|---|---|---|---|---|---|---|---|---|---|---|---|---|---|---|---|
| | Gas flow amount (cc/min) | | | Temper-ature (°C.) | Filming rate (μm/h) | Synthesis time (hour) | Gas flow amount (cc/min) | | | Temper-ature (°C.) | Filming rate (μm/h) | | | | Continuous cutting (min) | Intermittent cutting (min) |
| | H$_2$ | CH$_4$ | CO | | | | H$_2$ | CH$_4$ | CO | | | | | | | |
| 44 (Comp.) | 95 | 0 | 5 | 800 | 0.6 | 4 | 80 | 0 | 20 | 950 | 2.2 | 3.5 | 10 | <10 | <10 |
| 45 (Comp.) | 95 | 0 | 5 | 900 | 0.8 | 12 | — | — | — | — | — | — | 10 | <30 | <20 |
| 46 (Comp.) | 95 | 0 | 5 | 900 | 0.8 | 25 | — | — | — | — | — | — | 20 | <40 | <25 |
| 47 (Comp.) | 99 | 1 | 0 | 800 | 0.4 | 25 | — | — | — | — | — | — | 10 | <30 | <20 |
| 48 (Comp.) | 99 | 1 | 0 | 800 | 0.4 | 2 | 90 | 0 | 10 | 900 | 1.4 | 6.5 | 10 | <20 | <10 |
| 49 (Comp.) | 99 | 1 | 0 | 800 | 0.4 | 13 | 90 | 0 | 10 | 900 | 1.4 | 3.5 | 10 | <10 | <10 |
| 50 (Comp.) | 99 | 1 | 0 | 800 | 0.4 | 5 | 80 | 0 | 20 | 950 | 2.2 | 3.5 | 10 | <10 | <10 |
| 51 (Comp.) | 99 | 1 | 0 | 900 | 1.2 | 1.5 | 90 | 0 | 10 | 900 | 1.4 | 6 | 10 | <10 | <10 |

Note:
1 In 38 (Comp.), crack was generated at a tip end.
2 In 39 (Comp.), a film was peeled off after CVD.

TABLE 4

| Sample No. | First step | | | | | | Second Step | | | | | | Syn-thesis time (hour) | Film thick-ness (μm) | Cutting time resulting in peeling | |
|---|---|---|---|---|---|---|---|---|---|---|---|---|---|---|---|---|
| | Gas flow amount (cc/min) | | | Temper-ature (°C.) | Filming rate (μm/h) | Synthesis time (hour) | Gas flow amount (cc/min) | | | Temper-ature (°C.) | Filming rate (μm/h) | | | | Continuous cutting (min) | Intermittent cutting (min) |
| | H$_2$ | CH$_4$ | CO | | | | H$_2$ | CH$_4$ | CO | | | | | | | |
| 52 (Comp.) | 99 | 1 | 0 | 900 | 1.2 | 1.5 | 80 | 0 | 20 | 950 | 2.2 | 3.8 | 10 | <10 | <10 |
| 53 (Comp.) | 99 | 1 | 0 | 900 | 1.2 | 0.5 | 90 | 0 | 10 | 900 | 1.4 | 7 | 10 | <10 | <5 |
| 54 (Comp.) | 99 | 1 | 0 | 900 | 1.2 | 3 | 90 | 0 | 10 | 900 | 1.4 | 4.5 | 10 | <10 | <5 |
| 55 (Comp.) | 99.5 | 0.5 | 0 | 800 | 0.2 | 6 | 95 | 0 | 5 | 800 | 0.6 | 15 | 10 | <10 | <5 |
| 56 (Comp.) | 99.5 | 0.5 | 0 | 800 | 0.2 | 4 | 90 | 0 | 10 | 900 | 1.4 | 6.5 | 10 | <10 | <5 |
| 57 (Comp.) | 99.5 | 0.5 | 0 | 800 | 0.2 | 20 | 90 | 0 | 10 | 900 | 1.4 | 4.3 | 10 | <20 | <10 |
| 58 (Comp.) | 99.5 | 0.5 | 0 | 800 | 0.2 | 6 | 80 | 0 | 20 | 950 | 2.2 | 4 | 10 | <10 | <10 |
| 59 (Comp.) | 90 | 0 | 10 | 800 | 0.9 | 2 | 80 | 0 | 20 | 950 | 2.2 | 3.8 | 10 | <10 | <10 |
| 60 (Comp.) | 90 | 0 | 10 | 800 | 0.9 | 1 | 90 | 0 | 10 | 900 | 1.4 | 6.5 | 10 | <30 | <20 |
| 61 (Comp.) | 90 | 0 | 10 | 800 | 0.9 | 4 | 90 | 0 | 10 | 900 | 1.4 | 4.5 | 10 | <30 | <20 |
| 62 (Comp.) | 95 | 0 | 5 | 900 | 0.8 | 3 | 70 | 0 | 30 | 900 | 2.5 | 3 | 10 | <10 | <5 |
| 63 (Comp.) | 95 | 0 | 5 | 800 | 0.6 | 4 | 90 | 0 | 10 | 900 | 1.4 | 5.5 | 10 | — | — |
| 64 (Comp.) | 99 | 1 | 0 | 900 | 0.4 | 5 | 90 | 0 | 10 | 900 | 1.4 | 6 | 10 | — | — |
| 65 (Comp.) | 97 | 0 | 3 | 800 | 0.4 | 6 | 90 | 0 | 10 | 900 | 1.4 | 5.5 | 10 | <10 | <5 |
| 66 (Comp.) | 95 | 0 | 5 | 800 | 0.6 | 8 | 90 | 0 | 10 | 900 | 1.4 | 7 | 15 | <30 | <30 |

Note:
1 In 63 (Comp.), a film was peeled off after CVD.
2 In 64 (Comp.), a film was peeled off after CVD.
3 In 65 (Comp.), a surface roughness was large.
4 In 66 (Comp.), a surface roughness was large.

What is claimed is:

1. A diamond coated member comprising:
   a substrate,
   a first diamond coating layer which is directly deposited on and engaged with a part of the substrate having fine irregularities thereon, having substantially no voids left between the fine irregularities and the first diamond coating layer, said irregularities being sufficiently deep to provide engagement between the first diamond coating layer and the substrate, and
   a second diamond coating layer deposited on the first diamond coating layer comprising diamond having a higher wear resistance than that of the first coating layer.

2. The diamond coated member as defined in claim 1, wherein the second diamond coating layer comprises diamond of a high crystallinity.

3. The diamond coated member as defined in claim 1, wherein the part of said substrate having fine irregularities thereon comprises fine irregularities having an aperture diameter of 0.5 to 5 μm, an aperture depth of 0.5 to 10 μm and an aperture interval of 5 μm or less.

4. A diamond coated member obtained by the process comprising the steps of:
   a first coating step in which a first diamond coating layer is directly deposited on and engaged with a part of a substrate having fine irregularities formed thereon by a gas phase synthesis method in which a mixed gas comprising 80 to 93 volume % hydrogen, 0 to 2 volume % methane and 7 to 20 volume % carbon monoxide is reacted to deposit said first diamond coating layer directly on said substrate so that substantially no voids are left between the fine irregularities and the first diamond coating and so that said fine irregularities are sufficiently deep to provide engagement between the first diamond coating layer and the substrate; and
   a second coating step in which a second diamond coating layer comprising diamond of a higher wear resistance than the first diamond coating layer is deposited on a surface of the first diamond coating layer.

5. A diamond coated member obtained by the process comprising the steps of:

a first coating step in which a first diamond coating layer is directly deposited on and engaged with a part of a substrate having fine irregularities formed thereon by a gas phase synthesis method in which a mixed gas comprising 94 to 97 volume % hydrogen and 3 to 6 volume % carbon monoxide is reacted at a temperature of 800° to 900° C. to deposit said first diamond coating layer directly on said substrate so that substantially no voids are left between the fine irregularities and the first diamond coating and so that said fine irregularities are sufficiently deep to provide engagement between the first diamond coating layer and the substrate; and a second coating step in which a second diamond coating layer comprising diamond of a higher wear resistance than the first diamond coating layer is deposited on a surface of the first diamond coating layer.

6. A diamond coated member obtained by the process comprising the steps of:

a first coating step in which a first diamond coating layer is directly deposited on and engaged with a part of a substrate having fine irregularities formed thereon at a film forming rate of 0.1 to less than 1 µm/h by a gas phase synthesis method in which a mixed gas comprising 94 to 97 volume % hydrogen and 3 to 6 volume % carbon monoxide is reacted at a temperature of 800° to 900° C. to deposit said first diamond coating layer directly on said substrate so that substantially no voids are left between the fine irregularities and the first diamond coating and so that said fine irregularities are sufficiently deep to provide engagement between the first diamond coating layer and the substrate; and a second coating step in which a second diamond coating layer comprising diamond of a higher wear resistance than the first diamond coating layer is deposited on a surface of the first diamond coating layer at a film forming rate of 1 to 2 µm/h wherein the part of the substrate having fine irregularities formed thereon comprises fine irregularities having an aperture diameter of 0.5 to 5 µm, an aperture depth of 0.5 to 10 µm and an aperture interval of 5 µm or less.

* * * * *